(12) United States Patent
Tanguay et al.

(10) Patent No.: US 11,469,769 B1
(45) Date of Patent: Oct. 11, 2022

(54) DATA SAMPLER WITH CAPACITIVE DIGITAL-TO-ANALOG CONVERTER

(71) Applicant: Cadence Design Systems, Inc., San Jose, CA (US)

(72) Inventors: Louis-Francois Tanguay, Montréal (CA); Jean-Francois Delage, Montréal (CA); Guillaume Fortin, Montréal (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/305,570

(22) Filed: Jul. 9, 2021

(51) Int. Cl.
*H03M 1/66* (2006.01)
*H04L 12/40* (2006.01)

(52) U.S. Cl.
CPC ........ *H03M 1/66* (2013.01); *H04L 12/40052* (2013.01)

(58) Field of Classification Search
CPC ........................... H03M 1/66; H04L 12/40052
USPC .................................................. 341/144, 150
See application file for complete search history.

(56) References Cited

U.S. PATENT DOCUMENTS 9,225,560 B1* 12/2015 Mishra .............. H04L 25/03019
9,621,136 B1* 4/2017 Chang .................... H03L 7/091

* cited by examiner

*Primary Examiner* — Khai M Nguyen
(74) *Attorney, Agent, or Firm* — Schwegman Lundberg & Woessner, P.A.

(57) ABSTRACT

Various embodiments provide for a data sampler with one or more capacitive digital-to-analog converters (DACs) for adjusting a threshold voltage range of the data sampler. According to some embodiments, two or more capacitive DACs can be used to set a threshold voltage for a data sampler and, by doing so, serve as a trigger mechanism for the data sampler.

20 Claims, 12 Drawing Sheets

DATA SAMPLER WITH CAPACITIVE DIGITAL-TO-ANALOG CONVERTER

TECHNICAL FIELD

Embodiments described herein relate to circuits and, more particularly, to a data sampler with one or more capacitive digital-to-analog converters for adjusting a threshold voltage range of the data sampler.

BACKGROUND

Serial data links (or TX/RX links) convey data over various medium, such as a cable, a board trace or backplane. Such a medium is often referred to as a channel. A channel can be imperfect and cause impairments on signals transmitted over the channel, such as attenuation, reflection, and noise (e.g., crosstalk). These impairments can lead to transmission errors. The quality of a channel can determine an upper limit on its achievable rate. Additionally, other impairments in a serial data link can degrade overall system performance. For instance, circuit non-idealities can also cause a degradation in a system's performance. Overall, minimizing impairments can enable a channel to reach or achieve higher link rates.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
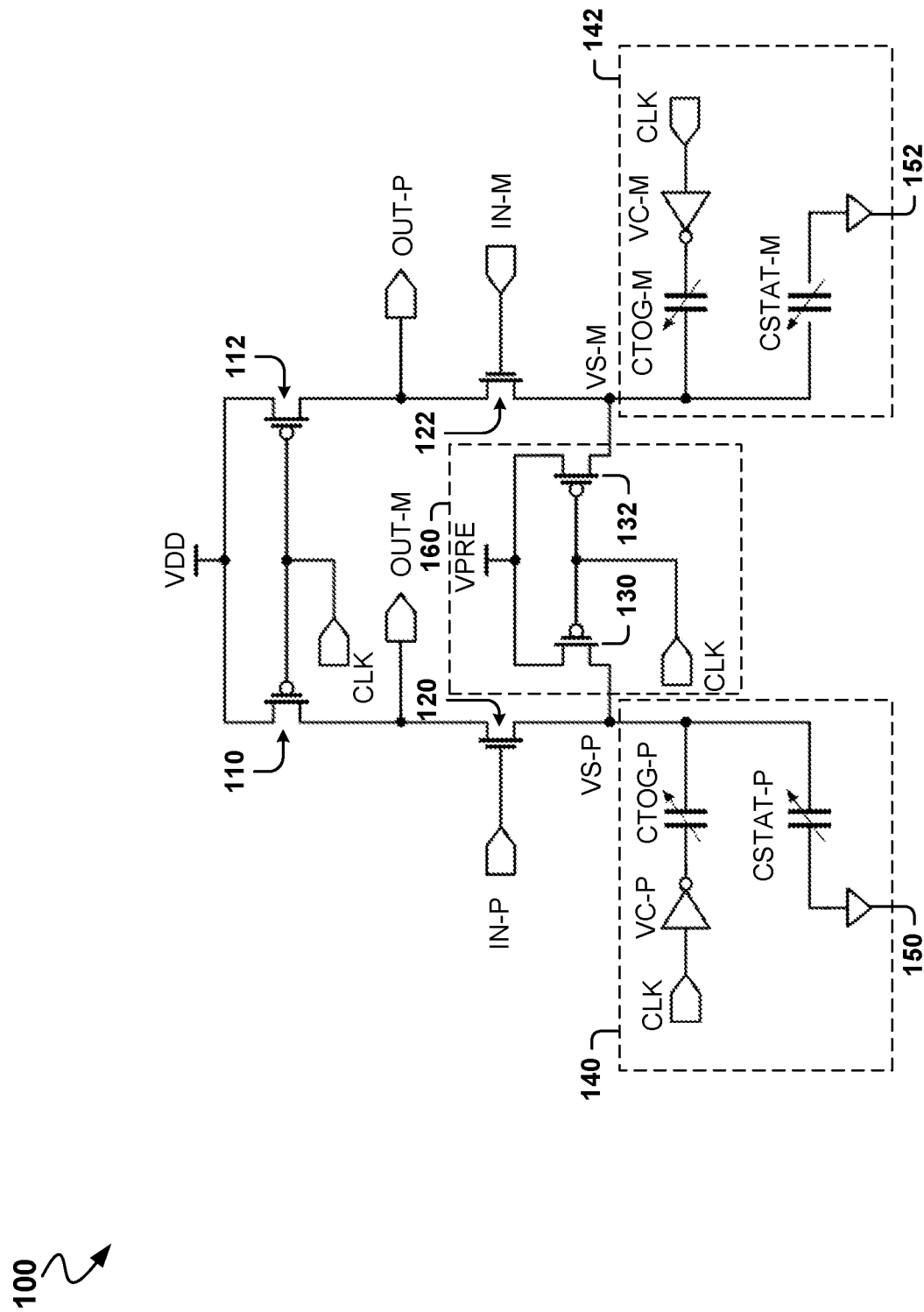
FIGS. 1 through 5 are schematics illustrating example circuits for a data sampler with capacitive digital-to-analog converters, in accordance with various embodiments.

Various embodiments provide for a data sampler with one or more capacitive digital-to-analog converters (DACs) for adjusting a threshold voltage over a certain range of the data sampler. For some embodiments, a data sampler described herein can be part of a circuit for high speed serial data communication, such as a serializer/deserializer (SerDes) circuit.

Traditionally, a data receiver (or receiver) comprises data comparators, clock samplers, and error comparators, each of which uses a data sampler circuit (or data sampler) to sample a received data signal. Both data comparators and clock samplers can be used to quickly and reliably sample a received data signal. For example, a data comparator can sample the eye of a received data signal at its center and recover a data stream. For a circuit using loop-unrolled Decision Feedback Equalizer (DFE) (also referred to as an unrolled DFE), at least two data comparators operating at different threshold voltage values may be used. A clock sampler, which can sample the eye at its edges, may be used to perform clock recovery and alignment at the data receiver. In contrast, an error comparator is often used to measure the eye shape for diagnostic purposes or to position a data sampler at the best sampling location using a servo loop. A conventional error comparator is usually able to sample any point in the eye. The error comparator's threshold voltage is typically the sum of the target voltage value and an input-referred offset value. An error comparator typically uses a data sampler that has a large threshold voltage range (e.g., one that can cover for the sum of random offsets, target threshold voltage, and first tap value; voltage range can reach 300-400 mV peak differential).

Based on how a data comparator, a clock sampler, and an error comparator are used within a data receiver, it would be beneficial for the threshold voltage characteristics of the data sampler to be a linear function of a target threshold voltage value (e.g., specified by a target threshold voltage code). Unfortunately, a data sampler can have their own impairments that adversely impact (e.g., the linearity and reliability of) a sample voltage value of the data sampler. Some of those impairments can include, for example: data sampler input-referred offsets; target threshold voltage finite step size quantization, such as threshold voltage step size error (e.g., Differential Non-Linearity (DNL)) or target threshold voltage step size error accumulation (e.g., Integral Non-Linearity (INL)); and data sampler input-referred noise. Other aspects of a data sampler performance considered include, for example, data sampler aperture center uncertainty; data sampler resolution speed (e.g., clock-to-Q delay).

Various embodiments described herein provide for a data sampler with one or more capacitive digital-to-analog converters (DACs) for adjusting a threshold voltage range of the data sampler. According to some embodiments, two or more capacitive DACs can be used to set a threshold voltage for a data sampler and, by doing so, serve as a trigger mechanism for the data sampler. For various embodiments, the data sampler is configured to receive a pair of data signals (e.g., differential pair of data signals) through two inputs and sample the differential pair. By sampling a differential pair (rather than a single data signal), various embodiments can provide symmetry within the data sampler and can significantly improve sampler performance metrics (such as common-mode rejection and better control over the threshold voltage). Additionally, for various embodiments, the data sampler comprises a portion (e.g., circuit portion) that provides a pre-charge voltage to each capacitive DAC of the data sampler, which can serve as a mechanism for controlling (e.g., fine-tuning) a response time and a voltage correction range of the data sampler.

Depending on the embodiment, each of the two or more capacitive DACs can redistribute charge within the capacitive DAC, and a final voltage (e.g., differential final voltage) at the outputs of the two or more capacitive DACs can determine a current target threshold voltage of the data sampler circuit. For some embodiments, the two or more capacitive DACs are arranged within the data sampler such that each operates as tail-degeneration capacitive DAC. In this way, some embodiments can achieve linear transfer characteristics (e.g., a threshold voltage curve that is linear with offset voltage), can provide better offset and offset drift performance than conventional data samplers (e.g., a complementary pair data sampler), and can avoid increasing the load on the data sampler's inputs (which receive a differential pair of data signals) by coupling to the sources of the input devices/transistors of the data sampler.

For some embodiments, the data sampler is configured such that offset correction and target threshold voltage are applied (e.g., set) differentially. In this way, a common-mode voltage at the data sampler's inputs can remain constant (e.g., common-mode voltage across the input devices/transistors of the data sampler circuit does not shift across a range of threshold voltages).

Some embodiments described herein provide a data sampler that: is fast (e.g., has low clock-to-Q delay and can handle large bandwidth); is accurate (e.g., low static and dynamic offsets); has a desirable threshold voltage range (e.g., large range for an error comparator); has a low capacitive load on signal inputs; has a threshold voltage curve that is linear with offset voltage (e.g., an offset voltage and an aperture center remain constant versus the target threshold voltage value); is optimized for power usage; or some combination thereof. The data sampler of some embodiments can enable a target threshold voltage to be set without slowing the data sampler or affecting its aperture center and aperture shape (aperture of the data sampler can define its sensitivity in time and its bandwidth).

Additionally, by use of various embodiments, a similar data sampler (or architecture) can be used for both a data comparator and an error comparator within a data receiver, which can ensure a sampling instant in the eye of a received data signal is well defined and can ensure that both the data comparator and error comparator perceive identical data signals.

As used herein, a capacitive digital-to-analog converter (DAC) can comprise circuitry that enables charge redistribution within a bank or array of capacitors to generate an analog output voltage. A capacitive DAC can comprise an array of N capacitors, where each capacitor in the array is associated with (e.g., binary and/or thermometer weighted by) one or more bit values within digital data (e.g., adjustment code) received by the capacitive DAC, and where the digital data can determine selection (e.g., enablement) of capacitors within the array for toggling between on and off (e.g., to voltage supply and ground respectively) based on (e.g., as a function of) a clock signal. For instance, a capacitor within a capacitive DAC that is selected/enabled based on a code (e.g., voltage code) can dynamically toggle between the voltage supply and ground based on (e.g., as a function of) a clock signal, while a disabled capacitor is statically coupled (e.g., statically coupled to ground or the voltage supply, depending on the embodiment). For capacitive DAC, a ratio of disabled capacitors to those capacitors being dynamically toggled, between the voltage supply and ground, can govern charge redistribution and within the capacitive DAC, thereby determining a final voltage outputted by the capacitive DAC (which as described herein can be used to control a threshold voltage of a data sampler). As used herein, capacitor value and capacitance are used interchangeably, and can comprise a numerical value. Additionally, as used herein, an input can comprise a physical input terminal of a circuit, and an output can comprise a physical output terminal of a circuit.

Reference will now be made in detail to embodiments of the present disclosure, examples of which are illustrated in the appended drawings. The present disclosure may, however, be embodied in many different forms and should not be construed as being limited to the embodiments set forth herein.

FIGS. 1 through 5 are schematics illustrating example circuits for a data sampler with capacitive digital-to-analog converters, in accordance with various embodiments.

Referring now to FIG. 1, a circuit 100 is illustrated, which can represent at least a portion (e.g., a first stage) of a larger circuit that implements a data sampler as described herein. According to some embodiments, the circuit 100 implements a race-to-bottom stage, which can assist in avoiding use of direct current (DC) voltage when operating the circuit 100. The circuit 100 as shown comprises clock signal inputs (CLK) to receive a clock signal, a positive signal input (IN-PLUS or IN-P) and a negative signal output (IN-MINUS or IN-M) to receive a pair (e.g., differential pair) of data signals, a positive signal output (OUT-PLUS or OUT-P) and a negative signal output (OUT-MINUS or OUT-M) to provide a transient sampling of the differential pair, capacitive DACs 140, 142, and a pre-charge voltage portion 160. In particular, the positive signal input IN-P can receive a first signal of the pair of data signals, the negative signal output IN-M can receive a second signal of the differential pair, the negative signal output OUT-M can provide a first sample of an amplified difference between the first signal and a first voltage threshold (set by the capacitive DAC 140), and the positive signal output OUT-P can provide a second sample of an amplified difference between the second signal and a second voltage threshold (set by the capacitive DAC 142). The circuit 100 receives a primary voltage (VDD, such as drain supply voltage) and a pre-charge voltage (VPRE), and coupled to ground at 150, 152.

The circuit 100 comprises a pair of N-type metal-oxide-semiconductor (NMOS) transistors 120, 122 to receive the pair of data signals, where the gate of the NMOS transistor 120 is coupled to the positive signal input IN-P, the gate of the NMOS transistor 122 is coupled to the negative signal input IN-M, the drain of the NMOS transistor 120 is coupled to the negative signal output OUT-M, and the drain of the NMOS transistor 122 is coupled to the positive signal output OUT-P. The NMOS transistors 120, 122 can represent the input devices of the circuit 100 and the data sampler being implemented by the circuit 100. The circuit 100 comprises a pair (e.g., differential pair) of P-type metal-oxide-semiconductor (PMOS) transistors 110, 112 that have gates coupled to a clock signal input and drive the reset of a previous sampling based on the clock signal. The sources of the PMOS transistors 110, 112 are coupled to the primary voltage VDD, the drain of the PMOS transistor 110 coupled to the negative signal output OUT-M and the drain of the NMOS transistor 120, and the drain of the PMOS transistor 112 coupled to the positive signal output OUT-P and the drain of the NMOS transistor 122.

As shown, each of the capacitive DACs 140, 142 are driven by the clock signal provided by the clock signal input (CLK), where the capacitive DAC 140 is coupled to the source (VS-P) of the NMOS transistor 120, and the capacitive DAC 142 is coupled to the source (VS-M) of the NMOS transistor 122. In this configuration, each of the capacitive DACs 140, 142 represents a tail-degeneration capacitive DAC coupled to the NMOS transistors 120, 122. The transient current flowing through the NMOS transistors 120, 122 originates from the charge redistribution inside the capacitive DACs 140, 142 respectively.

According to some embodiments, the capacitive DACs 140, 142 provide a separate capacitor bank on the sources of each of the pair NMOS transistors 120, 122, where each the capacitive DACs 140, 142 can generate a final voltage (at their respective source) by redistributing a charge within their respective capacitor bank based on an adjustment data (e.g., digital data, such as a threshold voltage code). The final voltage generated (at the sources of the NMOS transistors 120, 122) by each of the capacitive DACs 140, 142 can trigger an evaluation phase of the pair of data signals (received at inputs IN-P and IN-M) and can define a target threshold voltage for the circuit 100.

The capacitive DAC 140 comprises the clock signal input (CLK) to receive the clock signal, an inverter VC-P, and an array of capacitors represented by capacitors CTOG-P and CSTAT-P. In FIG. 1, capacitors CTOG-P represent one or more capacitors of the array that are currently selected/enabled to be toggled between the voltage source and ground as a function of the clock signal received through the inverter VC-P, while capacitors CSTAT-P one or more capacitors of the array that are currently unselected/disabled and statically coupled (e.g., tied) to ground. For various embodiments, the capacitive DAC 140 determines enablement/disablement of capacitors in the array of the capacitive DAC 140 based on digital data (e.g., adjustment digital data, such as a code provided to the circuit 100 to set a threshold voltage for the circuit 100). As described herein, the ratio of disabled capacitors to enabled capacitors (e.g., ratio of capacitors CSTAT-P to capacitors CTOG-P) for the capacitive DAC 140 can govern the charge redistribution within the array of capacitors of the capacitive DAC 140, which can determine a threshold voltage for the circuit 100 with respect to the NMOS transistor 120.

Similarly, the capacitive DAC 142 comprises the clock signal input (CLK) to receive the clock signal, an inverter VC-M, and an array of capacitors represented by capacitors CTOG-M and CSTAT-M. Like with the capacitive DAC 140, capacitors CTOG-M represent one or more capacitors of the array that are currently selected/enabled to be toggled between the voltage source and ground as a function of the clock signal received through the inverter VC-M, while capacitors CSTAT-M one or more capacitors of the array that are currently unselected/disabled and statically coupled (e.g., tied) to ground. For various embodiments, the capacitive DAC 142 determines enablement/disablement of capacitors in the array of the capacitive DAC 142 based on digital data (e.g., adjustment digital data, such as a code provided to the circuit 100 to set a threshold voltage for the circuit 100). Depending on the embodiment, the digital data can be the same or different/separate from the digital data used by the capacitive DAC 140. As described herein, the ratio of disabled capacitors to enabled capacitors (e.g., ratio of capacitors CSTAT-M to capacitors CTOG-M) for the capacitive DAC 142 can govern the charge redistribution within the array of capacitors of the capacitive DAC 142, which can determine a threshold voltage for the circuit 100 with respect to the NMOS transistor 122.

As also shown, the pre-charge voltage portion 160 of the circuit 100 is coupled to both the source (VS-P) of the NMOS transistor 120 and the source (VS-M) of the NMOS transistor 122. The pre-charge voltage portion 160 comprises a pair of PMOS transistors 130, 132, where the source of the PMOS transistors 130, 132 are coupled to the pre-charge voltage VPRE, where the drain of the PMOS transistor 130 is coupled to the source (VS-P) of the NMOS transistor 120, and where the drain of the PMOS transistor 132 is coupled to the source (VS-M) of the NMOS transistor 122. According to various embodiments, the pre-charge voltage portion 160 is configured to generate the pre-charge voltage VPRE for each of the capacitive DACs 140, 142 at the sources VS-P, VS-M respectively, which can control (e.g., fine-tune) a response time and threshold voltage range of the circuit 100 and the data sampler implemented by the circuit 100. In particular, for some embodiments, the pre-charge voltage VPRE is lower than the primary voltage VDD, which can reset voltages at the sources VS-P, VS-M to the pre-charge voltage VPRE and result in a quicker response from the pair of NMOS transistors 120, 122 compared with pre-charging VS-P and VS-M to the primary voltage VDD. This can allow the pair of NMOS transistors 120, 122 to have a larger overdrive voltage and to enter the ON state more quickly, which in turn can allow tuning of the rate at which the voltages of the positive signal output OUT-P and the negative signal output OUT-M drop towards ground. This can impact the overall response time of the circuit 100 and the input referred offset of the circuit 100.

During operation of the circuit 100, current flowing through each of the NMOS transistors 120, 122 can depend on an input voltage level and final voltage provided by each of the capacitive DACs 140, 142. During an evaluation phase of the circuit 100, the voltages at the outputs OUT-P and OUT-M can drop from VDD toward the ground at a speed that depends on the gate-source voltage (Vgs) of each of the NMOS transistors 122, 120. Such a gate-source voltage Vgs can be governed by the data signals received via the inputs IN-P and IN-M and applied at the gates of transistors 120, 122 respectively, and by the corresponding voltages applied to nodes VS-P and VS-M through capacitive DACs 140, 142.

Figure 2:
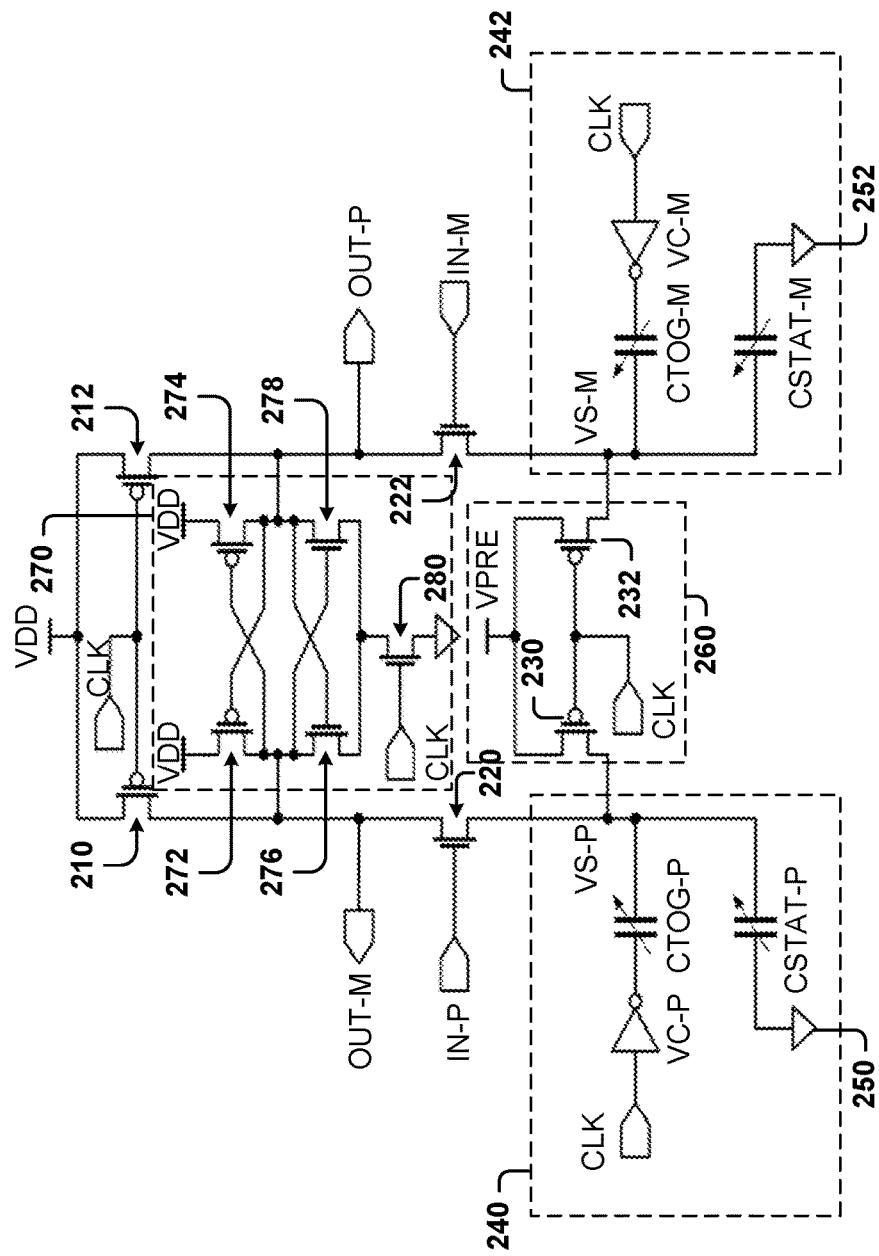

In FIG. 2, a circuit 200 is illustrated with a cross-coupled regenerative portion 270 comprising cross-coupled inverters coupled to the drain of a NMOS transistor 220 and the drain of a NMOS transistor 222. For some embodiments, elements 210, 212, 220, 222, 230, 232, 240, 242, 250, 252, 260 (and the associated inputs and outputs) of the circuit 200 are respectively similar to elements 110, 112, 120, 122, 130, 132, 140, 142, 150, 152, 160 of the circuit 100 described with respect to FIG. 1. As shown, the cross-coupled regenerative portion 270 comprises: a pair of cross-coupled PMOS transistors 272, 274 with sources coupled to the primary voltage VDD; a pair of cross-coupled NMOS transistors 276, 278 with drains coupled to the drains of the PMOS transistors 272, 274 respectively; and an NMOS transistor 280 with a gate coupled to the clock signal input, with a drain coupled to the sources of the NMOS transistors 276, 278, and with a source coupled to ground. For some embodiments, during operation of the circuit 200, the cross-coupled regenerative portion 270 can amplify and regenerate the voltage difference between the output OUT-P and the output OUT-M during a regeneration phase.

Figure 3:
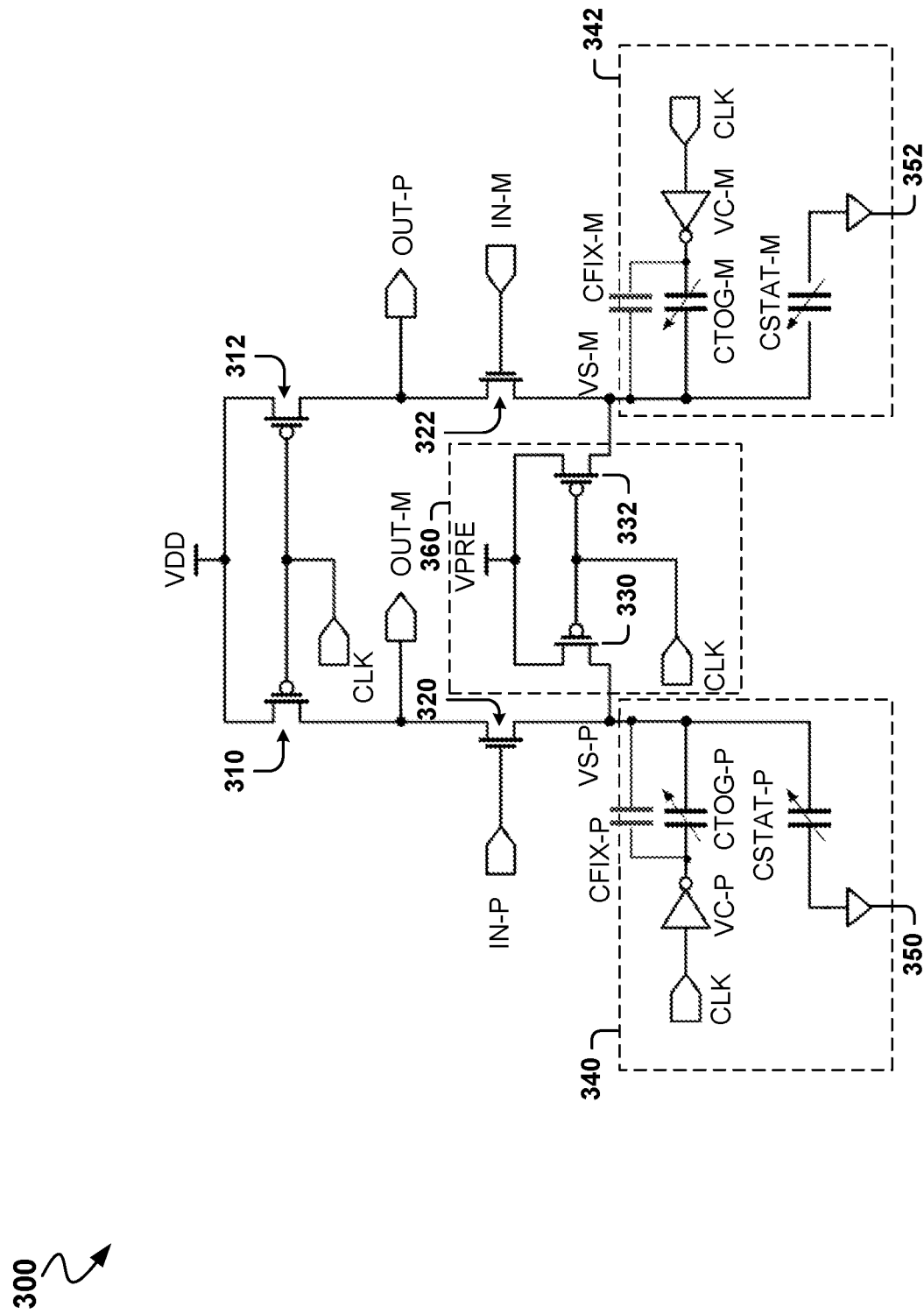

Referring now to FIG. 3, a circuit 300 is illustrated with capacitive DACs 340, 342, which each include a fixed capacitor (CFIX). For some embodiments, elements 310, 312, 320, 322, 330, 332, 350, 352, 360 (and the associated inputs and outputs) of the circuit 300 are respectively similar to elements 110, 112, 120, 122, 130, 132, 150, 152, 160 of the circuit 100 described with respect to FIG. 1. The capacitive DACs 340, 342 are respectively similar to the capacitive DACs 140, 142 but include fixed capacitors CFIX_P, CFIX_M respectively. According to various embodiments, by including the fixed capacitors CFIX_P, CFIX_M, the circuit 300 can better pull the voltages at the outputs OUT-P and OUT-M toward ground during an evaluation phase of a data sampler implemented by the circuit 300. In doing so, the circuit 300 can ensure that, at the end of an evaluation phase of a data sampler implemented by the circuit 300, the voltages at the outputs OUT-P and OUT-M are low enough to shut off input devices/transistors (e.g., NMOS transistors) of a latch portion of the data sampler (not shown) that is coupled to the outputs OUT-P and OUT-M. Adjustment of the CFIX-P and CFIX-M values can assist in achieving fast sampler response times while ensuring proper threshold voltage range.

Figure 4:
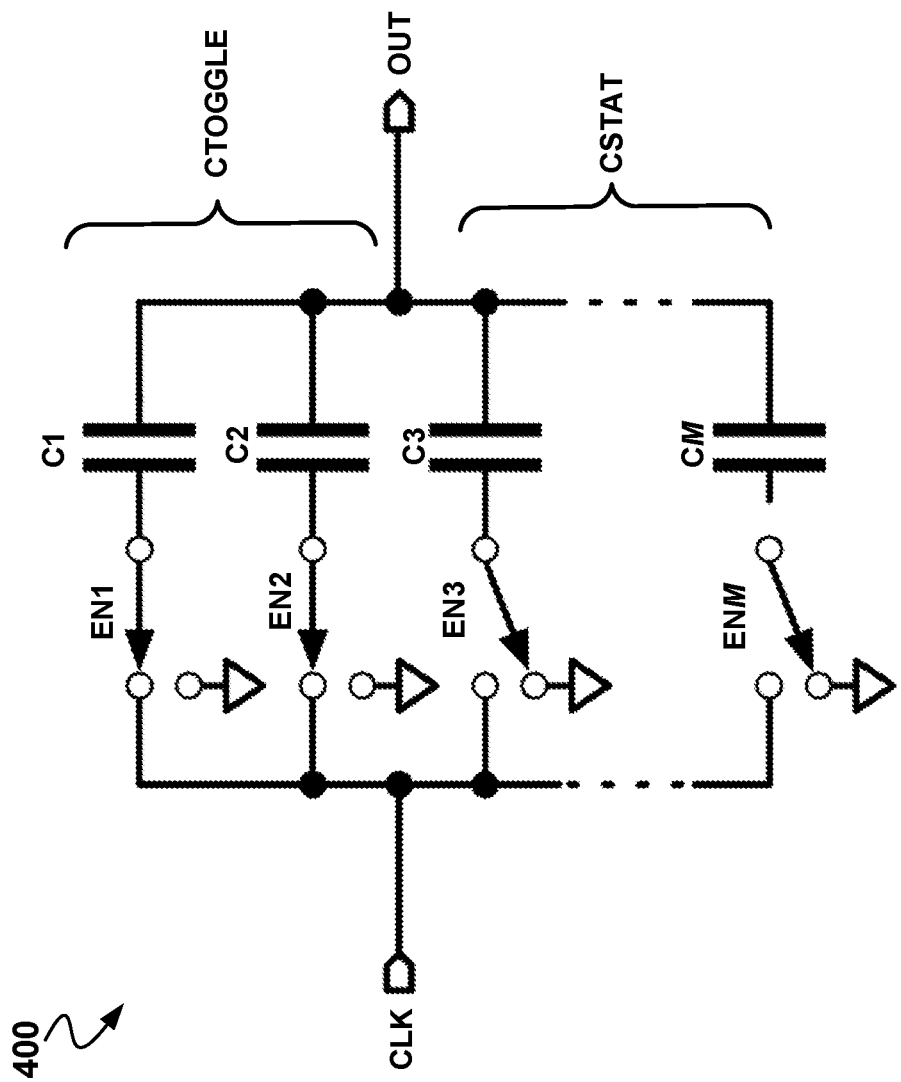

FIG. 4 illustrates an example capacitive DAC 400 that can be used with a data sampler, in accordance with various embodiments. In particular, the capacitive DAC 400 is a conceptual representation of a capacitive DAC that can be used by a data sampler of some embodiments, such as the capacitive DAC 140 or the capacitive DAC 142 described with respect to FIG. 1. As shown, the capacitive DAC 400 comprises a clock signal input (CLK) for receiving a clock signal, an array of capacitors C1 through CM arranged in parallel, and a voltage output (OUT) for outputting the final voltage generated by the charge distribution within the array of capacitors. Additionally, the capacitive DAC 400 comprises a plurality of switches EN1 through ENM corresponding to the array of capacitors C1 through CM, which control enabling and disabling the individual capacitors in the array. For instance, in FIG. 4, the capacitors C1 and C2 are illustrated as being enabled, while the capacitors C3 and CM are illustrated as being disabled. The capacitors of the array that are enabled (e.g., C1 and C2 via switches EN1 and EN2 respectively) cause those capacitors (CTOGGLE) to dynamically toggle between a voltage supply and ground as a function of the clock signal received via the clock signal input (CLK), while the capacitors of the array that are disabled (e.g., C1 and C2 via switches EN1 and EN2 respectively) cause those capacitors (CSTAT) to be statically coupled to ground. The enabling/disabling of capacitors C1 through CM within the array can be controlled based on digital data (e.g., target voltage code) received by the capacitive DAC, where the digital data can selectively control the switches EN1 through ENM that govern enabling/disabling of capacitors within the array.

Figure 5:
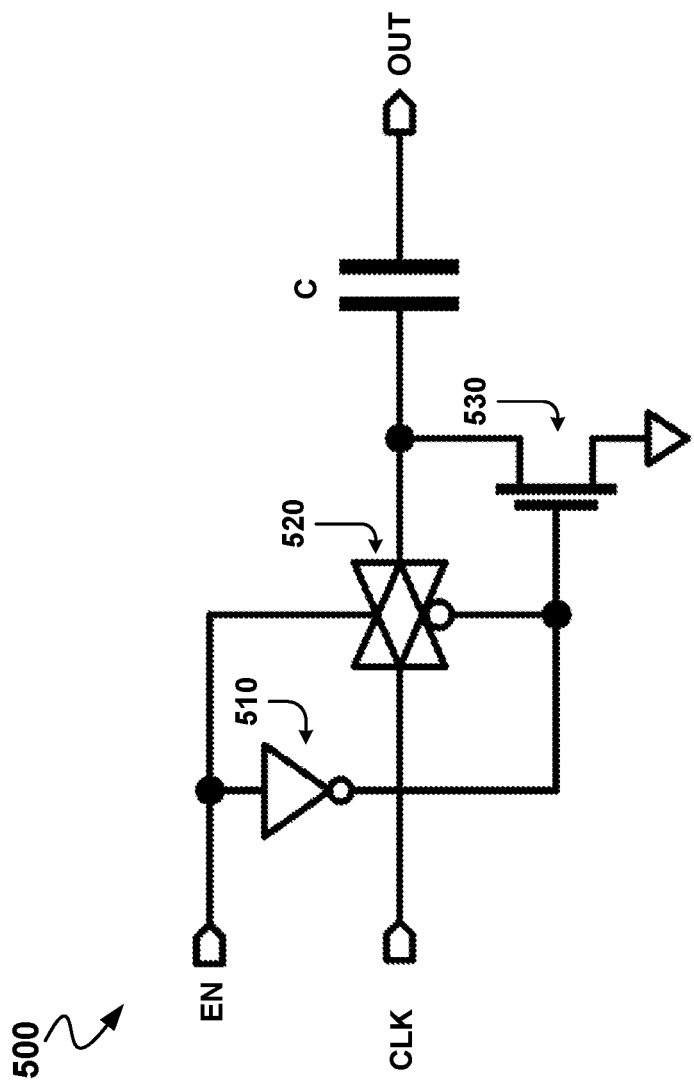

FIG. 5 illustrates a circuit 500 of an example capacitive unit of a capacitive DAC, where capacitive DAC comprises an array of capacitive units and where each capacitive unit can be implemented as shown by the circuit 500. As shown, the circuit 500 comprises an enable signal input (EN) to receive an enable signal, a clock signal input (CLK) for receiving a clock signal, a capacitor C, an inverter 510, a switch 520, an NMOS transistor 530, and an output (OUT) to provide a current charge of the capacitor C. During operation, the enable signal can control whether the capacitive unit represented is enabled (e.g., capacitor C is enabled) and the capacitor C is dynamically toggled between a voltage supply and ground based on the clock signal, or disabled (e.g., capacitor C is disabled) and the capacitor C is statically coupled (e.g., tied) to ground (or coupled to the voltage supply for alternative embodiments). In FIG. 5, when the enable signal received via the enable signal input EN represents an enable value (e.g., logical value of 1 or ON), the enable signal via the switch 520 permits the CLK input to dynamically toggle the capacitor C between the voltage supply and ground as a function of the clock signal (when the NMOS transistor 530 is disabled or in high impedance state). When the enable signal received via the enable signal input EN represents a disable value (e.g., logical value of 0 or OFF), the enable signal via the inverter 510 causes the NMOS transistor 530 to couple (and thereby statically toggle) the capacitor C to ground.

Figure 6:
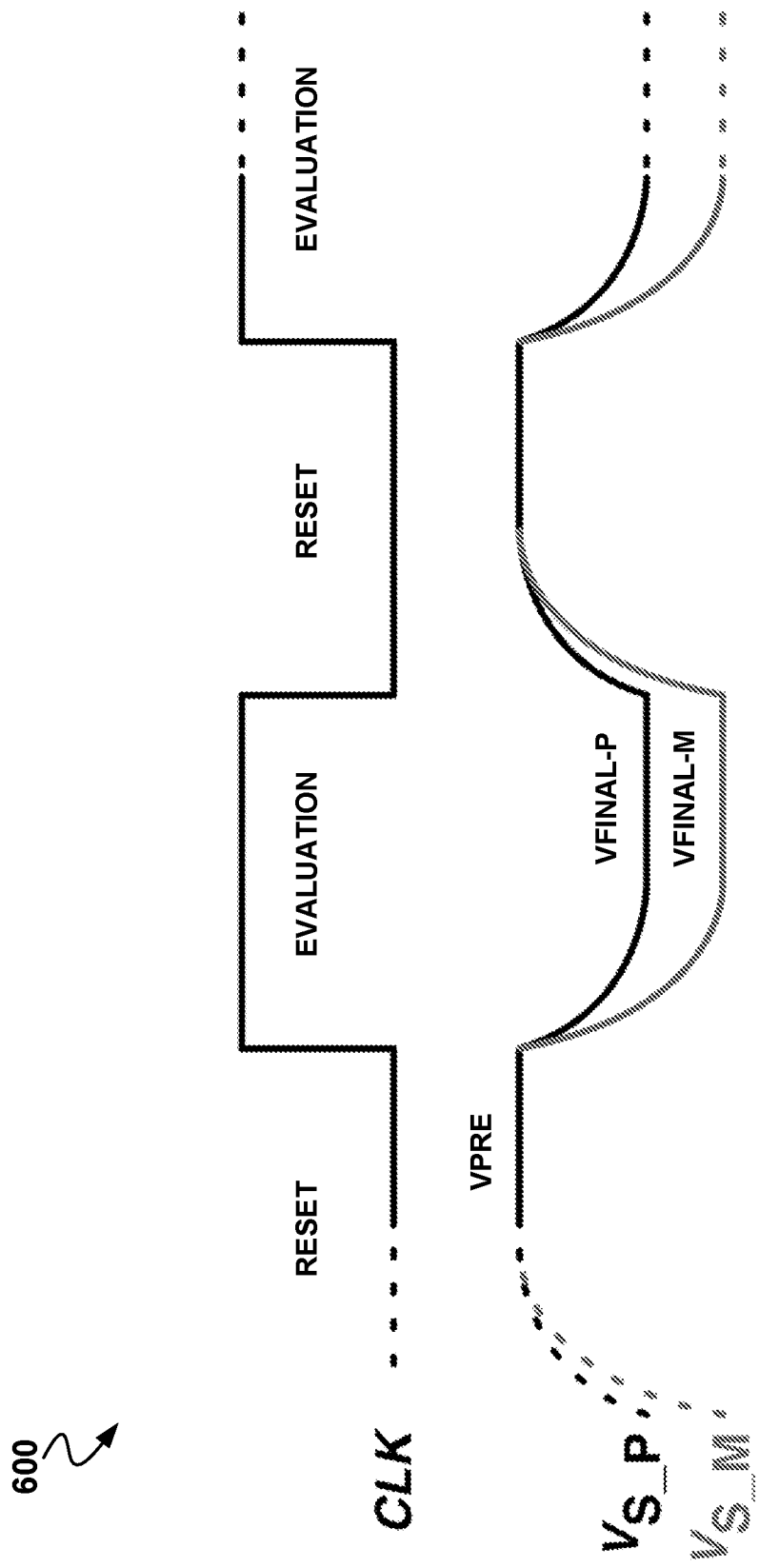
FIG. 6 is a chart illustrating example voltage levels relative to a clock signal in a data sampler with capacitive digital-to-analog converters, in accordance with various embodiments.

FIG. 6 is a chart 600 illustrating example voltage levels relative to a clock signal in a data sampler with capacitive digital-to-analog converters, in accordance with various embodiments. In particular, the chart 600 can illustrate the voltages at the sources VS-P, VS-M of the circuit 100 of FIG. 1 during operation of the circuit 100. During a reset phase of the circuit 100, the clock signal received via the clock signal input (CLK) is low, and the voltage at VS-P and VS-M and the voltages of the capacitors CTOG of the capacitive DACs 140, 142 of the circuit 100 are pulled to the pre-charge voltage VPRE (by the pre-charge voltage portion 160). During an evaluation phase of the circuit 100, the clock signal received via the clock signal input (CLK) is high, and the voltage at VS-P and VS-M are pulled toward ground, and charge redistribution occurs at VS-P and VS-M based on the capacitive DACs 140, 142. A final voltage at VS-P during an evaluation phase depends on a ratio of the capacitance of capacitors CTOG-P to the capacitance of capacitors CSTAT-P and can be determined as follows:

$$VS\_P^{final} = \frac{CSTAT\_P}{CSTAT\_P + CTOG\_P} \times VDD$$

Similarly, a final voltage at VS-M during an evaluation phase depends on a ration of the capacitance of capacitors CTOG-M to the capacitance of capacitors CSTAT-M and can be determined as follows:

$$VS\_M^{final} = \frac{CSTAT\_M}{CSTAT\_M + CTOG\_M} \times VDD$$

For some embodiments, based on the voltages at the data signal inputs IN-P and IN-M of the circuit 100, the circuit 100 is metastable when:

$$IN\_P-VS\_P^{final}=IN\_M-VS\_M^{final}$$

Based on this, for some embodiments, the threshold voltage of the circuit 100 is determined by:

$$VTHRESH=IN\_P-IN\_M=VS\_P^{final}-VS\_M^{final}$$

For some embodiments, the sum of final voltages at VS_P and VS_M is kept constant regardless of the difference between the final voltages VS_P and VS_M, thereby keeping one or more key sampler properties (e.g., resolution speed, aperture shape and center, and input referred offset) constant throughout the threshold voltage range. For some embodiments, this condition is achieved when the sum of capacitance values of CTOG-P and CSTAT-P is equal to the sum of capacitance values of CTOG-M and CSTAT-M.

Though not illustrated in the FIG. 1, the circuit 100 can include a switch that can be used to short the voltages at VS-P and VS-M during a reset phase (which is not illustrated in FIG. 6).

Figure 7:
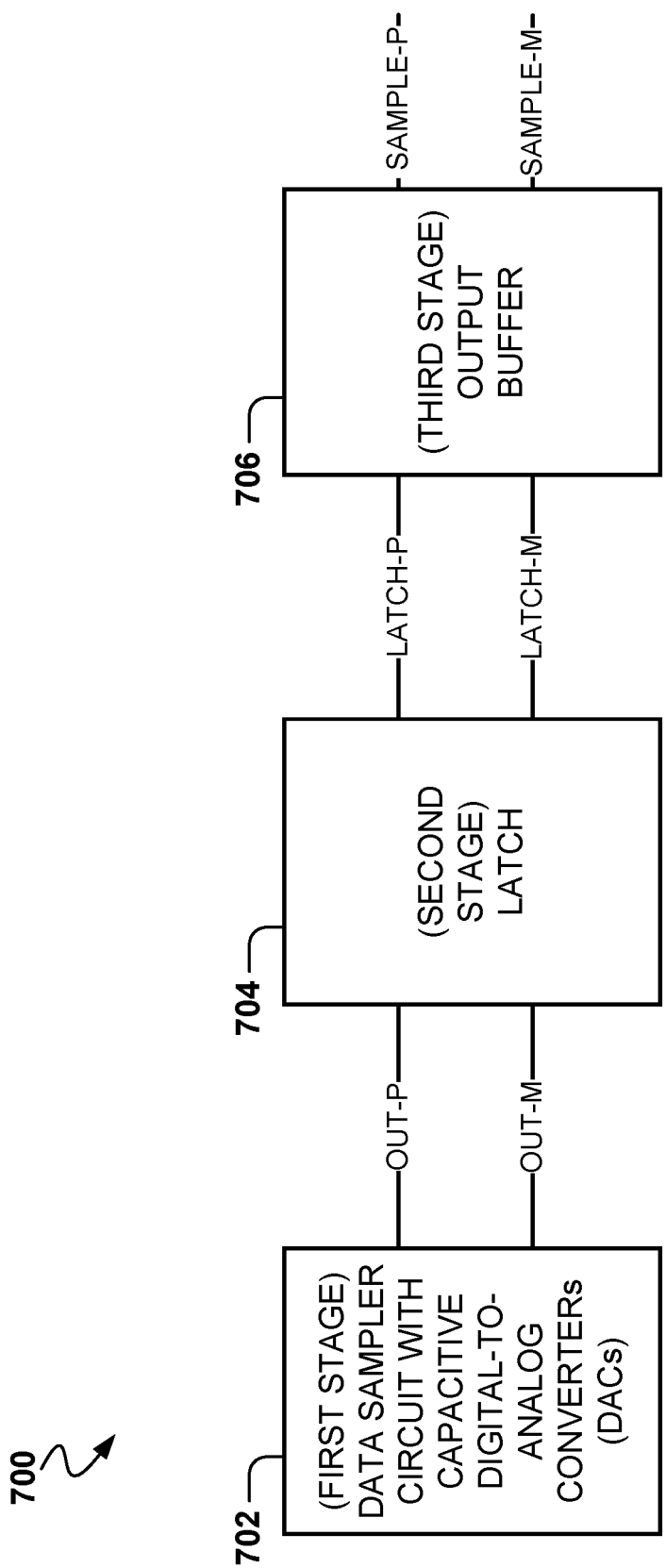
FIG. 7 is a block diagram of an example data sampler with capacitive digital-to-analog converters, in accordance with various embodiments.

FIG. 7 is a block diagram of an example data sampler 700 with capacitive digital-to-analog converters, in accordance with various embodiments. As shown, the data sampler 700 comprises three stages: a first stage that is implemented by a data sampler circuit (hereafter, the circuit 702) with capacitive DACs, a second stage implemented by a latch (hereafter, the latch 704) coupled to outputs OUT-P and OUT-M of the circuit 702, and a third stage that is implemented by an output buffer (hereafter, the output buffer 706) coupled to outputs LATCH-P and LATCH-M of the latch 704. As shown, the output of the data sampler 700 is provided via outputs SAMPLE-P and SAMPLE-M. Depending on the embodiment, the circuit 702 can be similar the circuit 100 of FIG. 1, the circuit 200 of FIG. 2, or the circuit 300 of FIG. 3.

Figure 8:
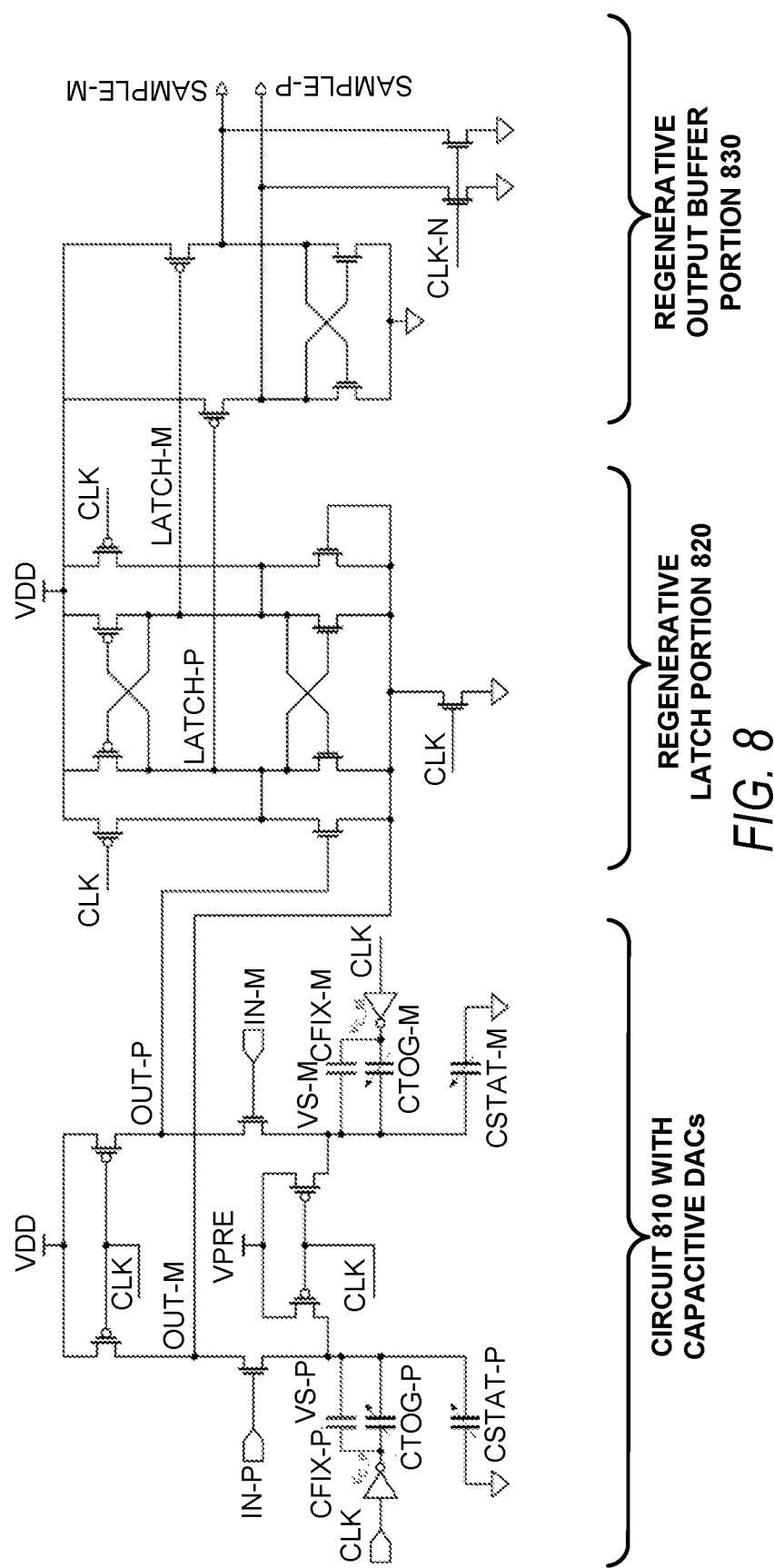
FIG. 8 is a schematic illustrating example circuits of a data sampler with capacitive digital-to-analog converters, in accordance with various embodiments.

FIG. 8 is a schematic illustrating example circuits of a data sampler 800 with capacitive digital-to-analog converters, in accordance with various embodiments. In particular, for some embodiments, the circuits of the data sampler 800 represents an example implementation of the data sampler 700 of FIG. 7. As shown, the data sampler 800 comprises a circuit 810 with capacitive DACs for adjusting a threshold voltage of the circuit 810, a regenerative latch portion 820 coupled to the circuit 810, and a regenerative output buffer portion 830 coupled regenerative latch portion 820. For various embodiments, the circuit 810 is similar to the circuit 300 of FIG. 3. As described herein, during an evaluation phase of the circuit 810, the voltages at the outputs OUT-P and OUT-M can drop from VDD toward the ground at a speed that depends on the relative gate-source voltage (Vgs) of each of the NMOS transistors used to receive the input data signal. At the end of the evaluation phase, voltages at the outputs OUT-P and OUT-M can be pulled down low enough toward ground (via fixed capacitors included by the capacitive DACs) to cause the input NMOS transistors of the regenerative latch portion 820 to shut off.

For some embodiments, the regenerative latch portion 820 latches the first sample from the output OUT-P and the second sample from the output OUT-M based on the clock signal, regenerates the latched first sample and the latched second sample, and outputs (to the regenerative output buffer portion 830) the regenerated latched first sample and the regenerated latched second sample. Additionally, for some embodiments, the regenerative output buffer portion 830 regenerates and buffers output of the regenerative latch portion 820.

Figure 9:
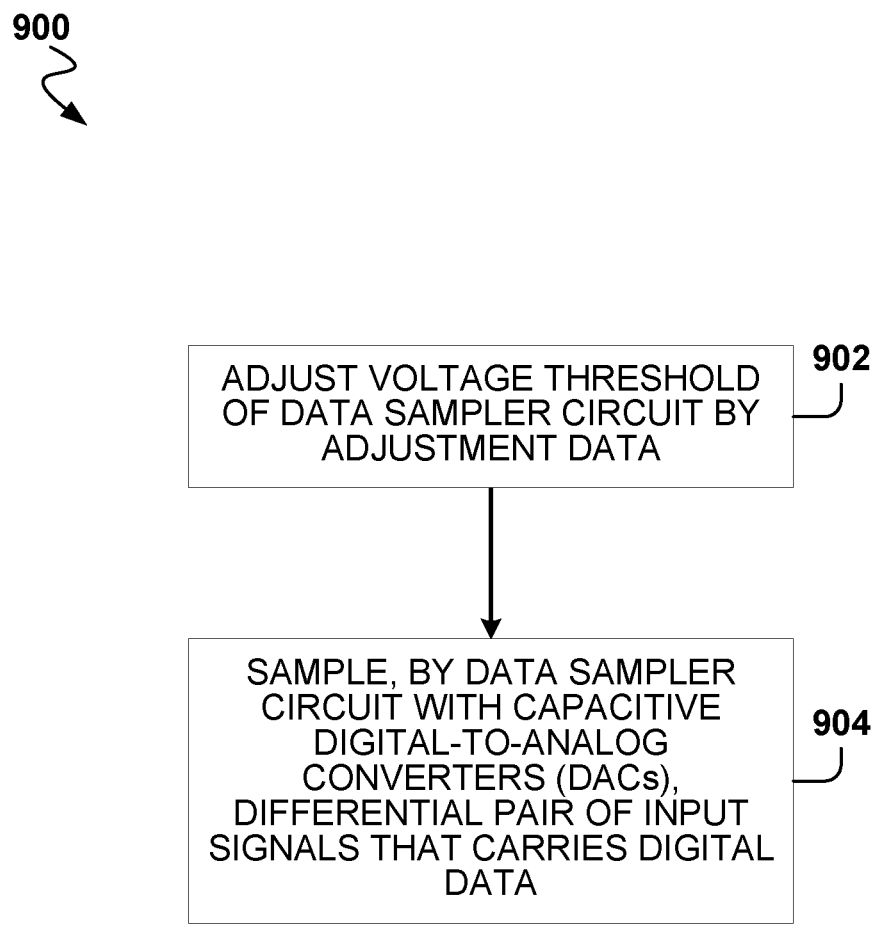
FIG. 9 is a flowchart illustrating an example method for operating a data sampler with capacitive digital-to-analog converters, in accordance with various embodiments.

FIG. 9 is a flowchart illustrating an example method 900 for operating a data sampler with capacitive digital-to-analog converters, in accordance with various embodiments. Some or all of the method 900 can be performed by a circuit, such as one or more of the circuits/components described herein with respect to FIGS. 1 through 5. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

At operation 902, a threshold voltage of a data sampler circuit (e.g., the circuit 100, 200, or 300) is set by providing adjustment data to the data sampler circuit. For some embodiments, the adjustment data comprises digital data, such as a code (e.g., threshold voltage code or data sampler code) that capacitive DACs of the data sampler circuit can use to enable/disable (e.g., select/unselect) capacitors within their respective arrays to redistribute charge and generate a final voltage.

After the threshold voltage of the data sampler circuit is adjusted (by operation 902), at operation 904, a differential pair of data signals is sampled by the data sampler circuit, where the differential pair of data signals carries data (e.g., from a transmitter to a receiver). According to various embodiments, the data sampler circuit comprises: a positive signal input configured to receive a first signal of the differential pair of data signals; a negative signal input configured to receive a second signal of the differential pair of data signals; a pair of transistors comprising a first transistor and a second transistor, the positive signal input being coupled to a gate of the first transistor, the negative signal input being coupled to a gate of the second transistor; a first capacitive digital-to-analog converter coupled to a source of the first transistor, the first capacitive digital-to-analog converter being configured to operate based on a clock signal, operation of the first capacitive digital-to-analog converter being adjusted based on the adjustment data; a second capacitive digital-to-analog converter coupled to a source of the second transistor, the second capacitive digital-to-analog converter being configured to operate based on the clock signal, operation of the second capacitive digital-to-analog converter being adjusted based on the adjustment data; a positive signal output coupled to a drain of the second transistor, the positive signal output being configured to provide a first sample of an amplified difference between the second signal and a second voltage threshold (that is set by a final voltage from the second capacitive digital-to-analog converter); and a negative signal output coupled to a drain of the first transistor, the negative signal output being configured to provide a second sample of an amplified difference between the first signal and a first voltage threshold (that is set by a final voltage from the first capacitive digital-to-analog converter). Depending on the embodiment, the data sampler circuit can be similar to one of the circuits 100, 200, or 300 described herein with respect to FIGS. 1 through 3.

Figure 10:
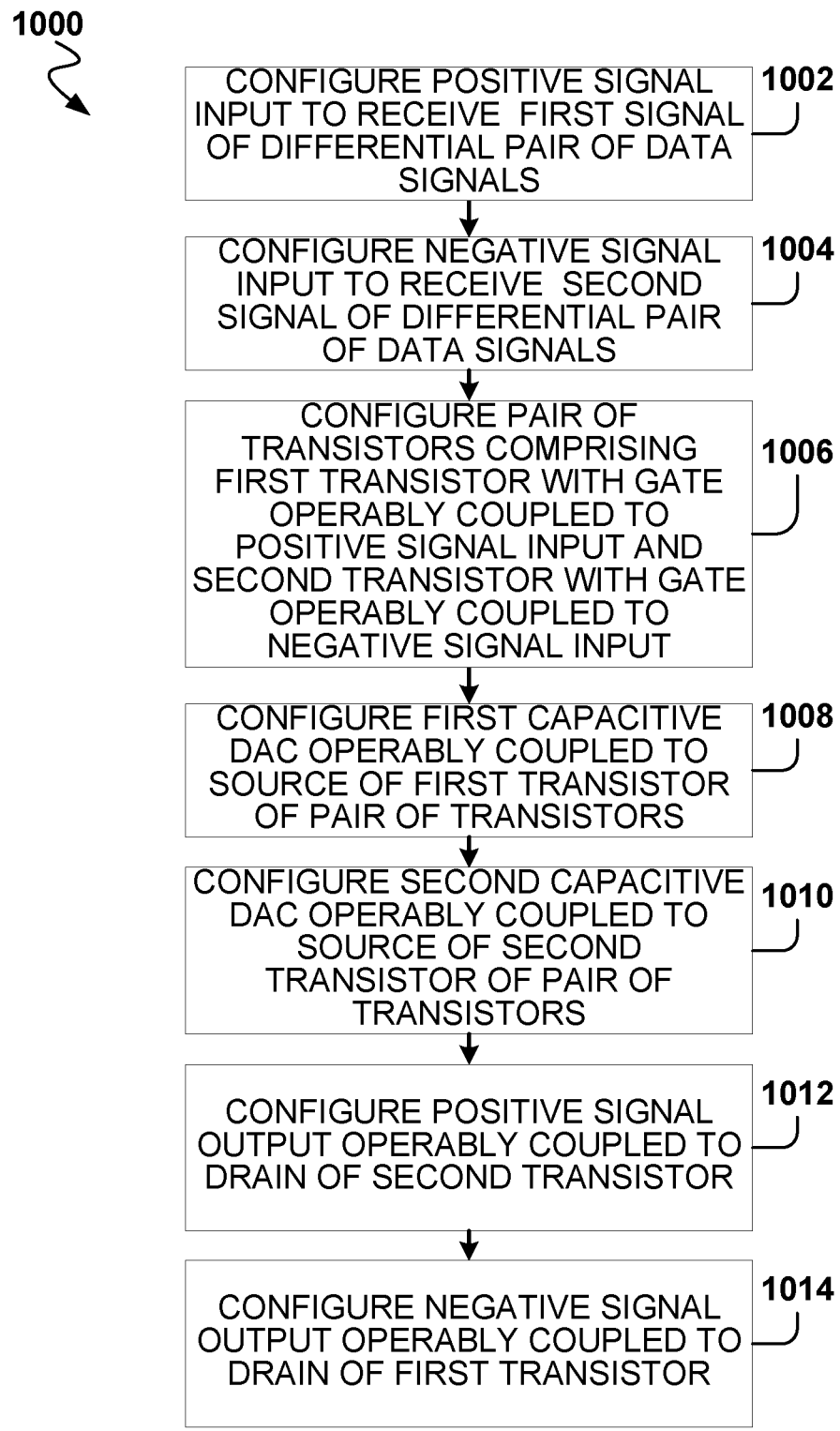
FIG. 10 is a flowchart illustrating an example method for generating a circuit design that includes a data sampler with capacitive digital-to-analog converters, in accordance with some embodiments.

FIG. 10 is a flowchart illustrating an example method 1000 for generating a circuit design that includes a data sampler with capacitive DACs, in accordance with some embodiments. It will be understood that the method 1000 can be performed by a device, such as a computing device executing instructions of an EDA software system, in accordance with some embodiments. Additionally, the method 1000 herein can be implemented in the form of executable instructions stored on a computer-readable medium or in the form of electronic circuitry. For instance, the operations of the method 1000 may be represented by executable instructions that, when executed by a processor of a computing device, cause the computing device to perform the method 1000. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Depending on the embodiment, the method 1000 can implement within a circuit design one of the circuits 100, 200, or 300 as described herein with respect to FIGS. 1 through 3.

At operation 1002, a positive signal input is configured in a circuit design, where the positive signal input is configured to receive a first signal of a differential pair of data signals. Similarly, at operation 1004, a negative signal input is configured in the circuit design, where the negative signal input is configured to receive a second signal of the differential pair of data signals.

A pair of transistors is configured in the circuit design at operation 1006, where the pair of transistors comprises a first transistor with a gate coupled to the positive signal input, and a second transistor with a gate coupled to the negative signal input.

At operation 1008, a first capacitive DAC is configured in the circuit design, where the first capacitive DAC is coupled to a source of the first transistor of the pair, and where the first capacitive DAC is configured to operate based on a clock signal. Similarly, at operation 1010, a second capacitive DAC is configured in the circuit design, where the second capacitive DAC is coupled to a source of the second transistor of the pair, and where the second capacitive DAC is configured to operate based on the clock signal.

With respect to operation 1012, a positive signal output is configured in the circuit design, where the positive signal output coupled to a drain of the second transistor of the pair, and where the positive signal output is configured to provide (based on the clock signal) one or more samples of an amplified difference between the second signal and a second voltage threshold (set by the second capacitive digital-to-analog converter). At operation 1014, a negative signal output is configured in the circuit design, where the negative signal output coupled to a drain of the first transistor of the pair, and where the negative signal output is configured to provide (based on the clock signal) one or more samples of an amplified difference between the first signal and a first voltage threshold (set by the first capacitive digital-to-analog converter).

Figure 11:
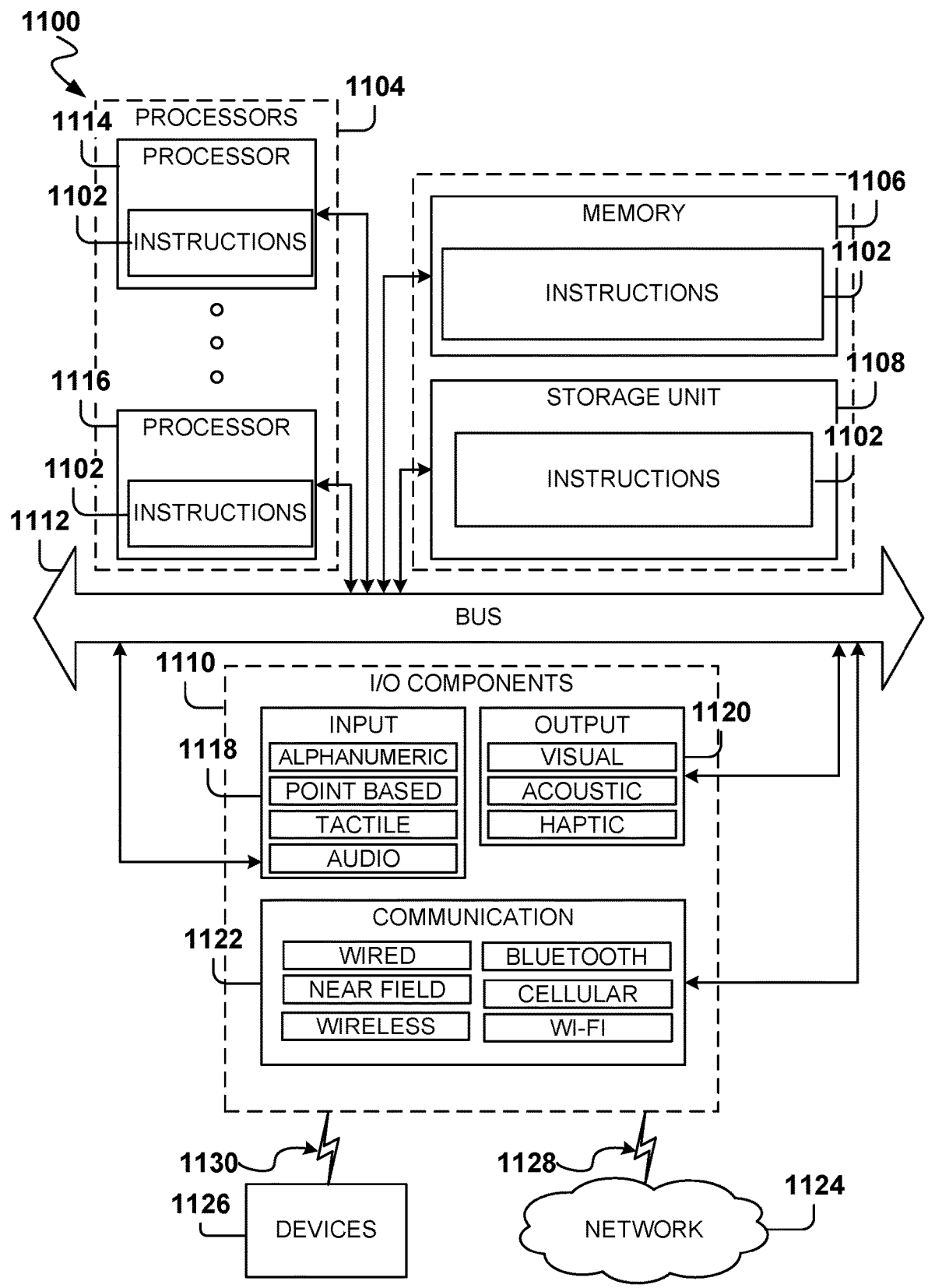
FIG. 11 is a block diagram illustrating components of a machine, according to some example embodiments, able to read instructions from a machine-readable medium and perform any one or more of the methodologies discussed herein.

FIG. 11 is a block diagram illustrating components of a machine 1100, according to some example embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a system within which instructions 1102 (e.g., software, a program, an application, an applet, an app, a driver, or other executable code) for causing the machine 1100 to perform any one or more of the methodologies discussed herein may be executed. For example, the instructions 1102 include executable code that causes the machine 1100 to execute the method 1000 described with respect to FIG. 10. In this way, these instructions 1102 transform the general, non-programmed machine 1100 into a particular machine programmed to carry out the described and illustrated method 1000 in the manner described herein. The machine 1100 may operate as a standalone device or may be coupled (e.g., networked) to other machines.

By way of non-limiting example, the machine 1100 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 1102, sequentially or otherwise, that specify actions to be taken by the machine 1100. Further, while only a single machine 1100 is illustrated, the term "machine" shall also be taken to include a collection of machines 1100 that individually or jointly execute the instructions 1102 to perform any one or more of the methodologies discussed herein.

The machine 1100 may include processors 1104, memory 1106, a storage unit 1108, and I/O components 1110, which may be configured to communicate with each other such as via a bus 1112. In an example embodiment, the processors 1104 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 1114 and a processor 1116 that may execute the instructions 1102. The term "processor" is intended to include multi-core processors 1104 that may comprise two or more independent processors (sometimes referred to as "cores") that may execute instructions 1102 contemporaneously. Although FIG. 11 shows multiple processors 1104, the machine 1100 may include a single processor with a single core, a single processor with multiple cores (e.g., a multi-core processor), multiple processors with a single core, multiple processors with multiple cores, or any combination thereof.

The memory 1106 (e.g., a main memory or other memory storage) and the storage unit 1108 are both accessible to the processors 1104 such as via the bus 1112. The memory 1106 and the storage unit 1108 store the instructions 1102 embodying any one or more of the methodologies or functions described herein. The instructions 1102 may also reside, completely or partially, within the memory 1106, within the storage unit 1108, within at least one of the processors 1104 (e.g., within the processor's cache memory), or any suitable combination thereof, during execution thereof by the machine 1100. Accordingly, the memory 1106, the storage unit 1108, and the memory of the processors 1104 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 1102. The term "machine-readable medium" shall also be taken to include any medium, or combination of multiple media, that is capable of storing instructions (e.g., instructions 1102) for execution by a machine (e.g., machine 1100), such that the instructions, when executed by one or more processors of the machine (e.g., processors 1104), cause the machine to perform any one or more of the methodologies described herein (e.g., method 1000). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 1110 may include a wide variety of components to receive input, provide output, produce output, transmit information, exchange information, capture measurements, and so on. The specific I/O components 1110 that are included in a particular machine 1100 will depend on the type of the machine 1100. For example, portable machines such as mobile phones will likely include a touch input device or other such input mechanisms, while a headless server machine will likely not include such a touch input device. It will be appreciated that the I/O components 1110 may include many other components that are not specifically shown in FIG. 11. The I/O components 1110 are grouped according to functionality merely for simplifying the following discussion and the grouping is in no way limiting. In various example embodiments, the I/O components 1110 may include input components 1118 and output components 1120. The input components 1118 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 1120 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 1110 may include communication components 1122 operable to couple the machine 1100 to a network 1124 or devices 1126 via a coupling 1128 and a coupling 1130 respectively. For example, the communication components 1122 may include a network interface component or another suitable device to interface with the network 1124. In further examples, the communication components 1122 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 1126 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In some example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 12:
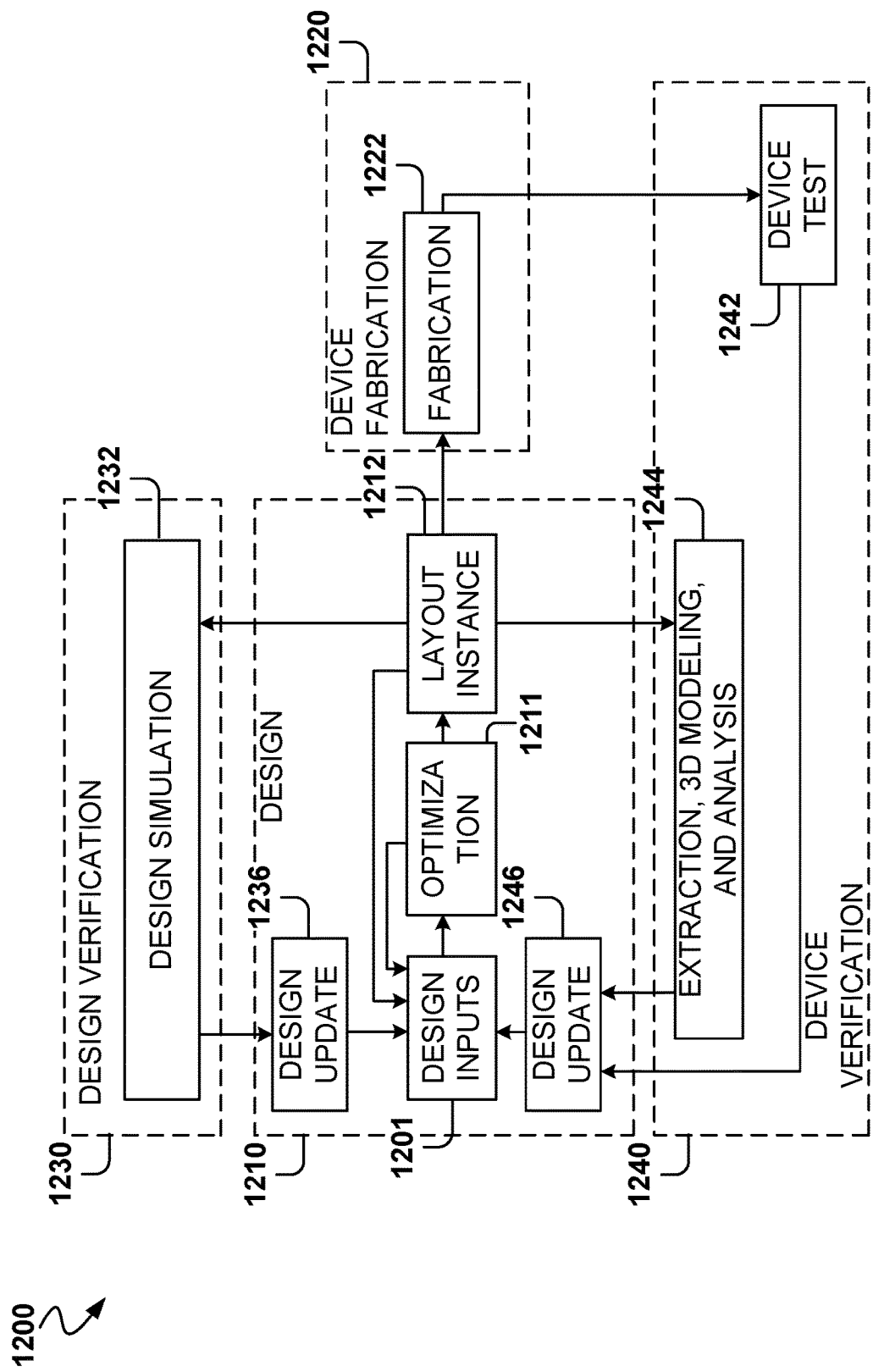
FIG. 12 is a diagram illustrating one possible design process flow for generating a circuit, including embodiments to implement a data sampler with capacitive digital-to-analog converters as described herein, and in various embodiments, to integrate the circuit with a larger circuit.

FIG. 12 is a diagram illustrating one possible design process flow for generating a circuit, including embodiments to implement a data sampler with capacitive digital-to-analog converters as described herein, and in various embodiments, to integrate the circuit with a larger circuit. As illustrated, the overall design flow 1200 includes a design phase 1210, a device fabrication phase 1220, a design verification phase 1230, and a device verification phase 1240. The design phase 1210 involves an initial design input operation 1201 where the basic elements and functionality of a device are determined, as well as revisions based on various analyses and optimization of a circuit design. This design input operation 1201 is where instances of an EDA circuit design file are used in the design and any additional circuitry is selected. The initial strategy, tactics, and context for the device to be created are also generated in the design input operation 1201, depending on the particular design algorithm to be used.

In some embodiments, following an initial selection of design values in the design input operation 1201, timing analysis and optimization according to various embodiments occurs in an optimization operation 1211, along with any other automated design processes. One such process may be the automated design of a partitioned root search for error locator polynomial functions in RS FEC decoding. As described below, design constraints for blocks of a circuit design generated with design inputs in the design input operation 1201 may be analyzed using hierarchical timing analysis, according to various embodiments. While the design flow 1200 shows such optimization occurring prior to a layout instance 1212, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1222.

After design inputs are used in the design input operation 1201 to generate a circuit layout, and any optimization operations 1211 are performed, a layout is generated in the layout instance 1212. The layout describes the physical layout dimensions of the device that match the design inputs. This layout may then be used in the device fabrication operation 1222 to generate a device, or additional testing and design updates may be performed using designer inputs or automated updates based on design simulation 1232 operations or extraction, 3D modeling, and analysis 1244 operations. Once the device is generated, the device can be tested as part of device test 1242 operations, and layout modifications generated based on actual device performance.

As described in more detail below, design updates 1236 from the design simulation 1232, design updates 1246 from the device test 1242, the extraction, 3D modeling, and analysis 1244 operations, or the design input operation 1201 may occur after an initial layout instance 1212 is generated. In various embodiments, whenever design inputs are used to update or change an aspect of a circuit design, a timing analysis and optimization operation 1211 may be performed.

For example, in various embodiments, a user may provide an input to a computing device indicating placement of elements of a circuit within a first portion (e.g., 106) of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
   a positive signal input configured to receive a first signal of a differential pair of data signals;
   a negative signal input configured to receive a second signal of the differential pair of data signals;
   a pair of transistors comprising a first transistor and a second transistor, the positive signal input being coupled to a gate of the first transistor, the negative signal input being coupled to a gate of the second transistor;
   a first capacitive digital-to-analog converter coupled to a source of the first transistor, the first capacitive digital-to-analog converter being configured to operate based on a clock signal;
   a second capacitive digital-to-analog converter coupled to a source of the second transistor, the second capacitive digital-to-analog converter being configured to operate based on the clock signal;
   a pre-charge voltage portion coupled to the source of the first transistor and the source of the second transistor, the pre-charge voltage portion being configured to generate a pre-charge voltage for each of the first capacitive digital-to-analog converter and the second capacitive digital-to-analog converter;
   a positive signal output coupled to a drain of the second transistor, the positive signal output being configured to provide, based on the clock signal, a first sample of an amplified difference between the second signal and a second voltage threshold, the second voltage threshold being set by the second capacitive digital-to-analog converter; and
   a negative signal output coupled to a drain of the first transistor, the negative signal output being configured to provide, based on the clock signal, a second sample of an amplified difference between the first signal and a first voltage threshold, the first voltage threshold being set by the first capacitive digital-to-analog converter.

2. The circuit of claim 1, wherein each of the first transistor and the second transistor comprises a NMOS transistor.

3. The circuit of claim 1, wherein the pre-charge voltage is adjustable.

4. The circuit of claim 1, wherein the pair of transistors is a first pair of transistors, and wherein the pre-charge voltage portion comprises a second pair of transistors that each have a drain coupled to a voltage source that provides the pre-charge voltage.

5. The circuit of claim 1, wherein the first capacitive digital-to-analog converter comprises a plurality of capacitors arranged in parallel, the plurality of capacitors comprising a selected set of capacitors and an unselected set of capacitors, the unselected set of capacitors including any capacitor not in the selected set of capacitors, the selected set of capacitors being dynamically toggled between a ground and a voltage supply based on the clock signal, the unselected set of capacitors being statically coupled to at least one of the ground or the voltage supply.

6. The circuit of claim 5, wherein charge redistribution in the first capacitive digital-to-analog converter is based on a ratio of capacitors that are coupled to the ground versus capacitors that are dynamically toggled between the ground and the voltage supply.

7. The circuit of claim 5, wherein the selected set of capacitors is determined based on digital code received by the first capacitive digital-to-analog converter.

8. The circuit of claim 1, wherein the second capacitive digital-to-analog converter comprises a plurality of capacitors arranged in parallel, the plurality of capacitors comprising a selected set of capacitors and an unselected set of capacitors, the unselected set of capacitors including any capacitor not in the selected set of capacitors, the selected set of capacitors being dynamically toggled between a ground and a voltage supply based on the clock signal, the unselected set of capacitors being statically coupled to at least one of the ground or the voltage supply.

9. The circuit of claim 1, comprising:
a cross-coupled regenerative portion comprising cross-coupled inverters coupled to the drain of the first transistor and the drain of the second transistor.

10. The circuit of claim 1, comprising:
a first fixed capacitor coupled to the source of the first transistor in parallel with capacitors dynamically toggled in the first capacitive digital-to-analog converter; and
a second fixed capacitor coupled to the source of the second transistor in parallel with capacitors dynamically toggled in the second capacitive digital-to-analog converter.

11. The circuit of claim 1, comprising:
a regenerative latch portion coupled to the positive signal output and the negative signal output, the regenerative latch portion being configured to latch the first sample and the second sample based on the clock signal, to regenerate the latched first sample and the latched second sample, and to output the regenerated latched first sample and the regenerated latched second sample.

12. The circuit of claim 11, comprising:
a regenerative output buffer portion coupled to the regenerative latch portion, the regenerative output buffer portion being configured to regenerate and buffer output of the regenerative latch portion.

13. The circuit of claim 11, comprising:
a pair of P-type metal-oxide-semiconductor (PMOS) transistors comprising a first PMOS transistor and a second PMOS transistor, a gate of the first PMOS transistor and a gate of second PMOS transistor each coupled to the clock signal, the first PMOS transistor being coupled between a voltage source and the positive signal output, the second PMOS transistor being coupled between the voltage source and the negative signal output.

14. A non-transitory computer-readable medium comprising instructions that, when executed by one or more processors of a computing device, cause the computing device to generate a circuit design by performing operations comprising:
configuring, in a circuit design, a positive signal input configured to receive a first signal of a differential pair of data signals;
configuring, in the circuit design, a negative signal input configured to receive a second signal of the differential pair of data signals;
configuring, in the circuit design, a pair of transistors that comprises a first transistor and a second transistor, the positive signal input being coupled to a gate of the first transistor, the negative signal input being coupled to a gate of the second transistor;
configuring, in the circuit design, a first capacitive digital-to-analog converter coupled to a source of the first transistor, the first capacitive digital-to-analog converter being configured to operate based on a clock signal;
configuring, in the circuit design, a second capacitive digital-to-analog converter coupled to a source of the second transistor, the second capacitive digital-to-analog converter being configured to operate based on the clock signal;
configuring, in the circuit design, a positive signal output coupled to a drain of the second transistor, the positive signal output being configured to provide, based on the clock signal, a first sample of an amplified difference between the second signal and a second voltage threshold, the second voltage threshold being set by the second capacitive digital-to-analog converter; and
configuring, in the circuit design, a negative signal output coupled to a drain of the first transistor, the negative signal output being configured to provide, based on the clock signal, a second sample of an amplified difference between the first signal and a first voltage threshold, the first voltage threshold being set by the first capacitive digital-to-analog converter.

15. The non-transitory computer-readable medium of claim 14, wherein the operations comprise:
configuring, in the circuit design, a pre-charge voltage portion coupled to the source of the first transistor and the source of the second transistor, the pre-charge voltage portion being configured to generate a pre-charge voltage for each of the first capacitive digital-to-analog converter and the second capacitive digital-to-analog converter.

16. The non-transitory computer-readable medium of claim 14, wherein the first capacitive digital-to-analog converter comprises a plurality of capacitors arranged in parallel, the plurality of capacitors comprising a selected set of capacitors and an unselected set of capacitors, the unselected set of capacitors including any capacitor not in the selected set of capacitors, the selected set of capacitors being dynamically toggled between a ground and a voltage supply based on the clock signal, the unselected set of capacitors being statically toggled to at least one of the ground or the voltage supply.

17. The non-transitory computer-readable medium of claim 14, wherein the operations comprise:
configuring, in the circuit design, a cross-coupled regenerative portion that comprises cross-coupled inverters coupled to the drain of the first transistor and the drain of the second transistor.

18. The non-transitory computer-readable medium of claim 14, wherein the operations comprise:
configuring, in the circuit design, a first fixed capacitor coupled to the source of the first transistor in parallel with capacitors dynamically toggled in the first capacitive digital-to-analog converter; and
configuring, in the circuit design, a second fixed capacitor coupled to the source of the second transistor in parallel with capacitors dynamically toggled in the second capacitive digital-to-analog converter.

19. The non-transitory computer-readable medium of claim 14, wherein the operations comprise:
configuring, in the circuit design, a regenerative latch portion coupled to the positive signal output and the negative signal output, the regenerative latch portion being configured to latch the first sample and the second sample based on the clock signal, to regenerate the latched first sample and the latched second sample, and to output the regenerated latched first sample and the regenerated latched second sample.

20. A method comprising:
adjusting a threshold voltage of a data sampler circuit by providing adjustment data to the data sampler circuit; and
sampling, by the data sampler circuit, a differential pair of data signals that carries data, the data sampler circuit comprising:
a positive signal input configured to receive a first signal of the differential pair of data signals;
a negative signal input configured to receive a second signal of the differential pair of data signals;

a pair of transistors comprising a first transistor and a second transistor, the positive signal input being coupled to a gate of the first transistor, the negative signal input being coupled to a gate of the second transistor;

a first capacitive digital-to-analog converter coupled to a source of the first transistor, the first capacitive digital-to-analog converter being configured to operate based on a clock signal, operation of the first capacitive digital-to-analog converter being adjusted based on the adjustment data;

a second capacitive digital-to-analog converter coupled to a source of the second transistor, the second capacitive digital-to-analog converter being configured to operate based on the clock signal, operation of the second capacitive digital-to-analog converter being adjusted based on the adjustment data;

a positive signal output coupled to a drain of the second transistor, the positive signal output being configured to provide a first sample of the first signal based on the clock signal; and a negative signal output coupled to a drain of the first transistor, the negative signal output being configured to provide a second sample of the second signal based on the clock signal.

\* \* \* \* \*